United States Patent [19]

Grohrock

[11] Patent Number: 4,804,086

[45] Date of Patent: Feb. 14, 1989

[54] TRANSPORT CONTAINER WITH AN INTERCHANGEABLE INSIDE CONTAINER

[75] Inventor: Peter Grohrock, Hoehenkirchen, Fed. Rep. of Germany

[73] Assignee: Siemens Aktiengesellschaft, Berlin and Munich, Fed. Rep. of Germany

[21] Appl. No.: 133,810

[22] Filed: Dec. 16, 1987

[30] Foreign Application Priority Data

Dec. 22, 1986 [DE] Fed. Rep. of Germany ....... 3644034

[51] Int. Cl.4 ............................................. B65D 85/00
[52] U.S. Cl. .................... 206/328; 220/371; 211/41
[58] Field of Search ............... 206/207, 454, 328, 334; 141/98; 414/217, 404, 417; 211/41; 220/469, 415, 371

[56] References Cited

U.S. PATENT DOCUMENTS

| | | | |
|---|---|---|---|
| 4,228,902 | 10/1980 | Schulte | 211/41 |
| 4,358,908 | 11/1982 | Song | 220/371 |
| 4,520,934 | 6/1985 | Aigo | 211/41 |
| 4,609,103 | 9/1986 | Bimer et al. | 206/328 |
| 4,618,071 | 10/1986 | Vincent | 220/371 |
| 4,668,484 | 5/1987 | Elliott | 206/207 |
| 4,682,927 | 7/1987 | Southworth et al. | 414/217 |
| 4,724,874 | 2/1988 | Parikh et al. | 141/98 |

FOREIGN PATENT DOCUMENTS 48602 2/1986 World Int. Prop. O. .......... 414/217

OTHER PUBLICATIONS

Publication "The Nucleus of the Asyst-SMIF System" from Asyst Technologies, Inc.

Primary Examiner—David T. Fidei
Attorney, Agent, or Firm—Hill, Van Santen, Steadman & Simpson

[57] ABSTRACT

A transport container with an interchangeable, bipartite inside container includes an outside hood, an outside bottom plate, an inside hood, an inside bottom plate, two closing levers, a sealing element and a semiconductor holder. A filter element is built into the container to provide a particle-type transportation container for transporting and storing semiconductor wafers in a semiconductor wafer cassette and for use in differing air pressure conditions and air purity conditions.

11 Claims, 4 Drawing Sheets

FIG 3
FIG 4
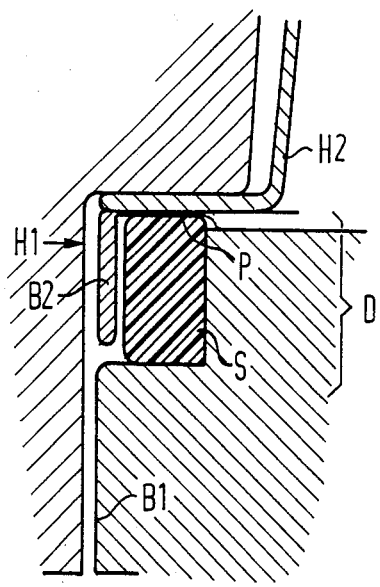
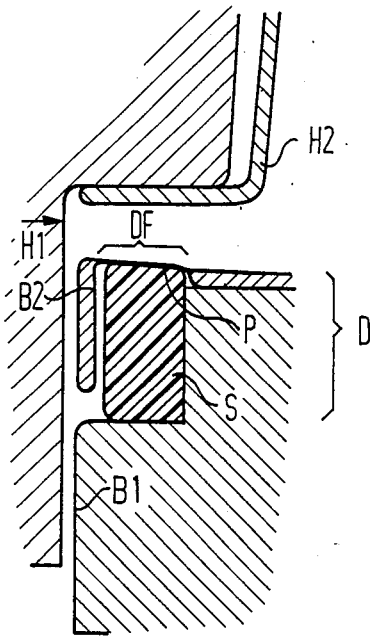

TRANSPORT CONTAINER WITH AN INTERCHANGEABLE INSIDE CONTAINER

BACKGROUND OF THE INVENTION

1. Field of the Invention

The present invention relates generally to a transport container with an interchangeable, bipartite inside container.

2. Description of the Related Art

Transport containers are used during the transportation of semiconductor wafers to protect the semiconductor wafers from contamination by ambient air which does not meet the highest cleanliness standards. For this reason, one of the most important properties of a transport container is its particle tightness.

There are number of possibilities for designing transport containers. For example, an especially simple design for a transport container is provided when the container is composed only of an outside hood, an outside bottom plate, and a semiconductor wafer holder. Another, more complicated structure is a transport container having an interchangeable inside container within which a semiconductor wafer holder is secured. A common feature to all such transport containers is that they have the same size and the same outside dimensions in order to be interchangeable with one another. They should also comply with certain standardized dimensions.

Standard dimensions for transport containers are recited, for example, in the publication document number 1332 of Semiconductor Equipment and Materials Institute, Inc., dated Jan. 10, 1986. The recommended standards are summarized under the term "standard mechanical interface for wafer cassette transfer" standard, also known as the SMIF standard. All of the most important dimensions of a transport container, as well as its essential outside component parts are recited in this publication. This publication also provides recommendations that the component parts of the transport container should meet.

The publication SMIF-Pod, "The Nucleus of the Asyst-SMIF system" of Asyst Technologies, Inc., discloses a transport container having an interchangeable inside container. The transport container is manufactured in accordance with the aforementioned SMIF specifications and is suitable for the acceptance of semiconductor wafers. In cross-sectional drawings, the details such as the inside hood semiconductor wafer holder, the outside hood, and the bottom plate of the transport container are shown being loaded with a semiconductor wafer cassette.

It is, of course, known to use transport containers for storing and transporting semiconductor wafers. Such transport containers are manufactured and distributed by various companies such as, for example, Asyst and Empak. Previous transport containers, however, involve either simple structures in which no inside containers are provided, or involve transport containers having inside containers that are not particle-tight. The demand made of the particle tightness of these transport containers is low, so that they can be utilized only in clean rooms with filtered ambient air. Another disadvantage of a simple structured transport container is that the transport container must be replaced and cleaned after a certain number of process steps in the semiconductor manufacturing process. When transport containers having inside containers are used, the contaminated inside container is replaced with a new one.

SUMMARY OF THE INVENTION

An object of the invention is to provide a closeable and dust-tight transport container of standardized outside dimensions having a semiconductor wafer holder moveably disposed within an inside hood to avoid friction.

This and other objects are inventively achieved by a transport container including an inside hood and an inside bottom plate which together form a closed inside container and within which is secured an interchangeable semiconductor wafer holder secured to the inside hood and moveable therewithin by the provision of film hinges.

The transport container of the present invention is for transporting and storing semiconductor wafers in a semiconductor wafer cassette. The transport container includes an outside hood and an outside bottom plate, an inside hood and an inside bottom plate, two closing levers for non-positive closing of the outer hood and the outer bottom plate, and an interchangeable semiconductor holder secured to the inside hood.

The advantages achieved with the invention are that the semiconductor transport container, within which are transported semiconductor wafers, can be used in or moved through rooms with a lower clean room category and can also be used in ambient air. As a result of the novel design of the semiconductor wafer holder in the transport container, no additional particles are released when loading and unloading a container with semiconductor wafers. This is achieved in that the semiconductor wafer holder does not have any sliding parts, and touches the inner bottom plate only with two narrow ridges. During loading and unloading, this leads to the fact that only a rolling motion is carried out at the contacting surfaces of the narrow ridges of the semiconductor wafer holder with the inner bottom plate. During fluctuating pressure conditions, a filter in the inside bottom plate provides a particle-free air stream to ensure that clean conditions are maintained within the container.

Further developments of the invention include providing a sealing element or gasket for sealing engagement with the inside bottom plate. An assortment of nubs and depressions are provided at various locations to assist in alignment and connection of the various parts of the transport container. An interchangeable semiconductor wafer holder for mounting between the inner hood and the inner base plate is also provided.

BRIEF DESCRIPTION OF THE DRAWINGS

FIG. 3 is an enlarged fragmentary view of a sealing element for air-tight closure of the transport container of the invention;

FIG. 4 is an enlarged fragmentary view of the sealing element of FIG. 3 showing the container being opened.

DESCRIPTION OF THE PREFERRED EMBODIMENTS

Figure 1:
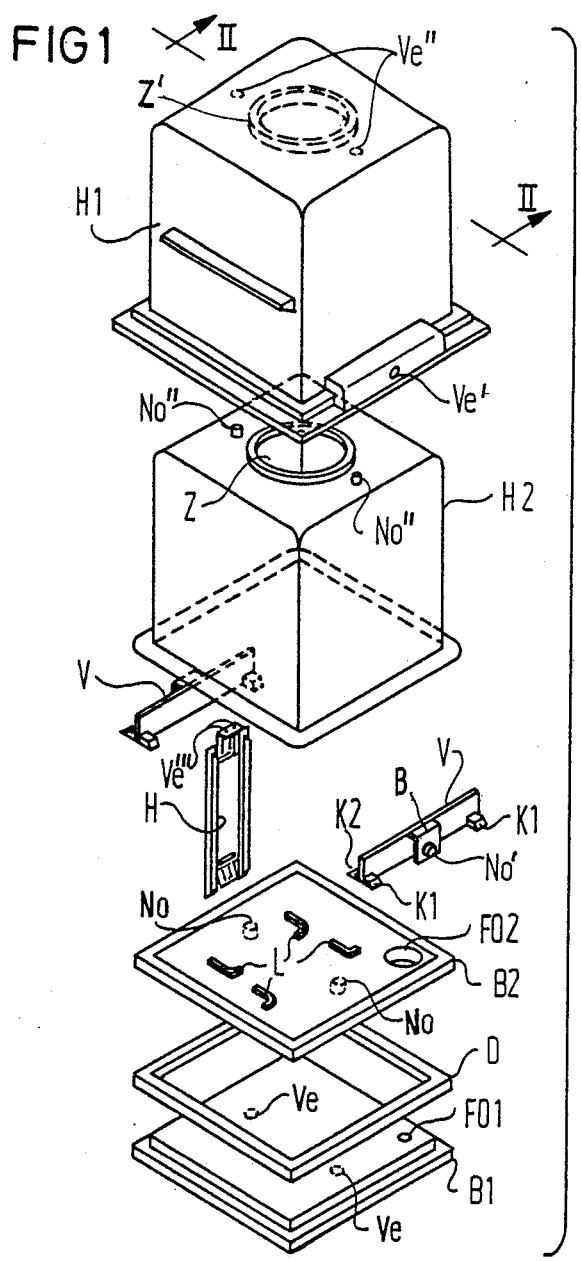
FIG. 1 is an exploded perspective view of the individual elements of the transport container according to the principles of the present invention.

In FIG. 1, a transport container includes an outer bottom plate B1; a sealing element, or gasket, D; an inner bottom plate B2; two closing levers V; a semiconductor wafer holder H; an inside hood H2; and an outside hood H1. On the inner bottom plate B2, two outwardly directed nubs or buttons No of different thicknesses extend downwardly therefrom for aligning and holding the outer bottom plate B1 by extending into a pair of similarly arranged recesses or blind holes Ve. The nubs No and the recesses Ve are, in a preferred embodiment, star shaped, although other shapes are of course possible. The ensures proper alignment of the inner plate B2 with the outer plate B1.

The sealing element D is composed of an expanded silicone caoutchouc, or rubber, ring to which a polyethylene foil or film is applied. The sealing element D is inserted into a U-shaped edge, or channel extending around the inner bottom plate B2. The sealing element D of the illustrated embodiment is rectangular in shape to conform to the container. Four L-shaped elevations L are provided extending from the inner bottom plate B2 for engagement with a semiconductor wafer cassette CASS (shown in FIG. 2).

Figure 2:
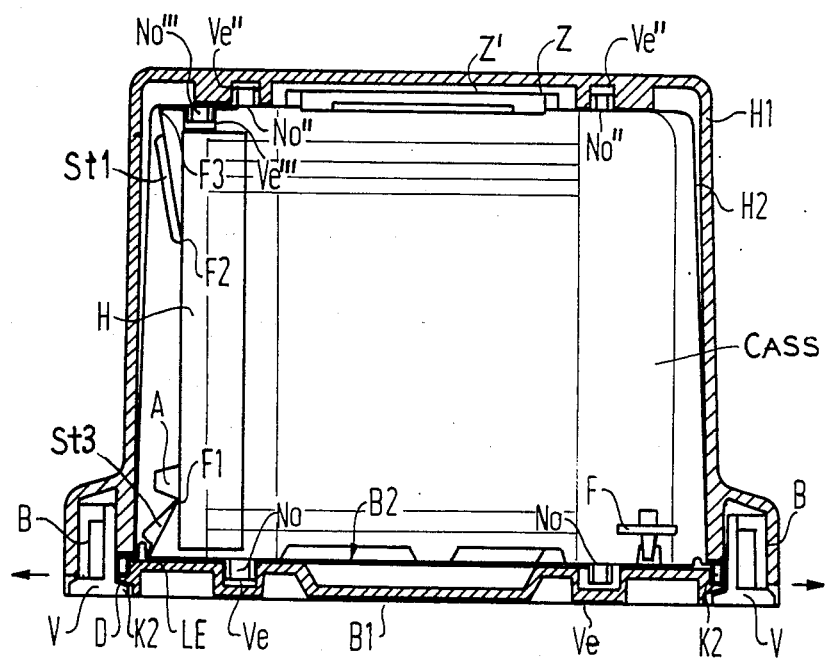
FIG. 2 is a cross section along line II—II of FIG. 1 showing the transport container of the invention including a filter element on an inner bottom plate.

The outer bottom plate B1 is provided with an opening FO1, and the inner bottom plate B2 is provided with an opening FO2 for placement in registration with the opening FO1. A filter element, such as the filter element F shown in FIG. 2, is provided in the opening FO2 in the inner bottom plate B2 so that a particle-free air stream flows therethrough during fluctuations in the ambient pressure conditions.

Each of the two closing levers V for non-positive closing of the outer hood H1 to the outer bottom plate B1 are secured by nub-depression connections with the outer hood H1. In the illustrated embodiment, a nub No' extends laterally from each of the closing levers V for engagement with a recess Ve' at either side of the outer hood H1. The closing levers V also include projecting edges K1 and K2 at each long side. The projecting edges K1 and K2 in the illustrated embodiment are tabs extending opposite one another at the ends of the closing levers V. The edges K1 of the closing levers V each contain a bore through which pins of a loading and unloading machine are conducted in order to automatically open and close the transport container.

The inside hood H2 and the outside hood H1, as well as the semiconductor wafer holder H and the inside hood H2, are connected to one another by nub-depression connections. Accordingly, nubs No" are provided at a top surface of the inside hood H2 for engagement into recesses Ve", shown in broken outline, at the inside surface of the outside hood H1. Similarly, recesses Ve'" are provided in the semiconductor wafer holder H for engagement with nubs within the inside of the inside hood H2. A centering ring Z on the inside hood H2 facilitates fast attachment of the inside hood H2 to the outside hood H1 by fitting into a similarly shaped recess Z', shown in broken outline, at the inside surface of the outside hood H1. The recesses Ve" and the ring receiving recess Z' are blind holes and do not extend through the wall surface of the outside hood H1 in which they are provided. Although other shapes are envisioned, it is preferred that the nubs No" and recesses Ve" be of a star shape.

The dimensions of the individual parts of the transport container of the invention are selected to comply with the specifications of the SMIF standards for Semiconductor Equipment and Materials Institute, Inc. The wall thickness for the inside hood as well as for the inner bottom plate amounts to 0.6 mm, whereas a wall thickness of about 3 mm is selected for the outer hood and for the bottom plate. The inside hood, the inner bottom plate and the semiconductor wafer holder are all manufactured of polyethylene, and the outer hood, the outer bottom plate and the closing bolt are manufactured of polycarbonate.

FIG. 2 shown a cross section of the transport container which includes the outer plate B1 the sealing element D, the inner bottom plate B2, the two closing levers V, the semiconductor wafer holder H, the inside hood H2 as well as the outside hood H1. Shown within the transport container is a semiconductor wafer cassette CASS, which holds a plurality of semiconductor wafers in parallel arrangement. It is preferred that the fastening of the semiconductor wafer holder H to the inside hood H2, the fastening of the inside hood H2 to the outside hood H1, and the inside bottom plate B2 to the outside bottom plate B1 be provided by nub-depression connections which have the advantage of being easily detachable.

The projecting edge parts K2 of the closing lever V can be clearly seen in FIG. 2 holding the outer bottom plate B1 to the outer hood H1 through the sealing element D. Opening of the transport container is carried out by moving the closing levers V in the directions indicated by the arrows shown in FIG. 2 so that the edge parts K2 no longer lie under the outer bottom plate B1. This is accomplished by the pins of the loading and unloading machine. As the levers V are moved to the opened condition, a spring bias is exerted toward the original closed position by fastening clips B of the closing lever V, which are secured to the outside hood H1 through nub-depression connections and on which are provided the nubs No'.

Since the transport container is exposed to different pressure conditions, a filter element F at the inside of the bottom plate B2 provides a particle-free air stream between the inside and the outside of the transport container. Instead of providing an additional filter element, it is also possible to supply a filter membrane mounted in the inner bottom plate B2.

The semiconductor wafer holder H is seated in a moveable fashion in the inside hood H2 by film hinges F1, F2 and F3. A spacer A is also provided extending from a rear surface of the holder H to maintain a minimum spacing between the semiconductor wafer holder H in the inside hood H2. A ledge LE on the inner bottom plate B2 serves to support the lower portion of the semiconductor wafer holder H.

In FIGS. 3 and 4, the sealing element or gasket D is shown and is composed of an expanded silicone caoutchouc, or silicone rubber, ring S and a polyethylene foil or film P arranged thereabove. The silicone rubber ring S, of course, corresponds to the shape of the inner bottom plate B2. The thickness of the polyethylene film at a sealing surface DF of the gasket D is approximately 0.1 mm. The material hardness of the rubber ring is preferably 5 degrees Shore. To increase the particle tightness, the inner bottom plate B2 overlaps the silicone rubber ring S. In FIG. 3, the sealing element D is in the closed condition in the transport container; and in FIG. 4, by contrast, the transport container is open. The outer contours of the inside hood H2, the outer bottom plate B1, and the inside hood H1 can be clearly seen in both figures. Thus, the inner bottom plate B2 has a thin portion overlying the sealing gasket D and a thicker portion on either side thereof, the outside edge portion being folded down along side the gasket D to form a U-shaped portion.

Figure 5:
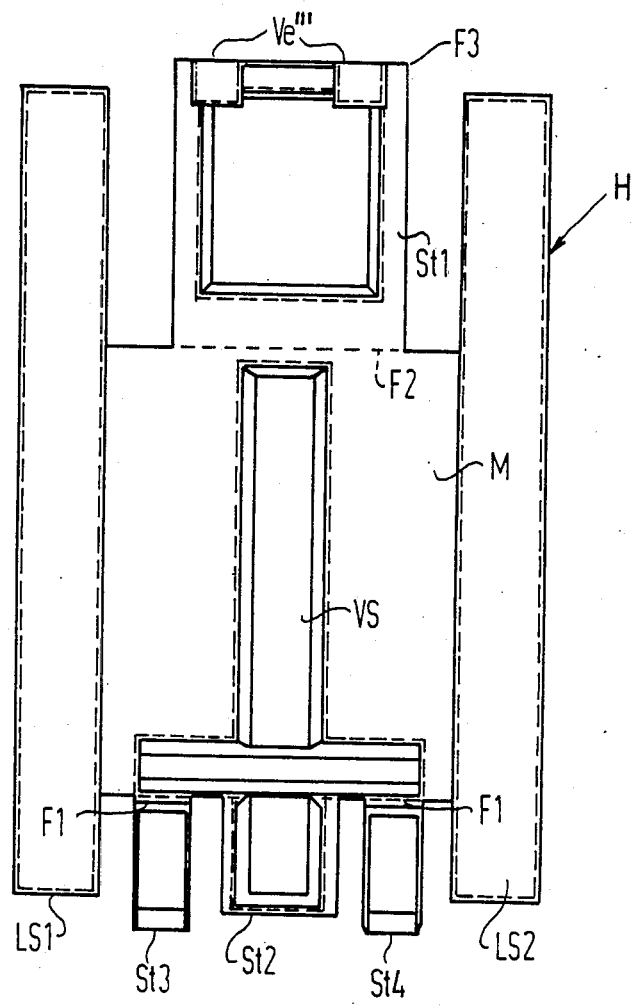
FIG. 5 is a plan view of a semiconductor wafer holder for use in the present transport container.

FIG. 5 shows the semiconductor wafer holder H for use in the transport container. The broken lines of FIG. 5 of the semiconductor wafer holder indicate the wall thickness of the material; the wall thickness, for example, amounts to 0.6 mm. The wafer holder H includes two lateral longitudinal webs LS1 and LS2 and a reinforced middle web M. The semiconductor wafers contact the semiconductor wafer holder only at a reinforcement VS on the middle web M. Two moveable, narrow mounting webs St3 and St4 are attached to a lower portion of the middle web M of the semiconductor wafer holder H by two thin film hinges F1. The mounting webs St3 and St4 are augmented in the middle by a stationary web St2 that serves as a spacer to maintain the holder H spaced from the inside bottom plate.

The upper portion of the wafer holder H includes two depressions Ve''' by which the semiconductor wafer holder H is secured to the inner hood H2. The depressions Ve''' have a further web arranged perpendicularly to the drawing connected to an upper web St1 through a film hinge F3. The upper web St1 is connected to the center web M by a film hinge F2. The film hinges F2 and F3 are formed thicker and therefore more inflexible than the film hinges F1.

By comparison of FIGS. 2 and 5, the position of the mounting webs St1, St3 and St4 can be seen, as well as the positions of the film hinges F1, F2 and F3. Thus, the holder H is hingedly moveable within the inner container.

Although other modifications and changes may be suggested by those skilled in the art, it is the intention of the inventor to embody within the patent warranted hereon all changes and modifications as reasonably and properly come within the scope of his contribution to the art.

I claim:

1. A transport container for transporting and storing semiconductor wafers in a semiconductor wafer cassette, comprising:
    an outside hood;
    an outside bottom plate;
    an inside hood;
    an inside bottom plate that forms a closed inside container with said inside hood;
    first and second closing levers for non-positive closing of said outside hood with said outside bottom plate;
    a sealing element for air-tight closure of said transport container; and
    an interchangeable semiconductor wafer holder secured to said inside hood and hingedly moveable relative to said transporting container.

2. A transporting container as claimed in claim 1, further comprising:
    a filter provided in said inside bottom plate to provide a particle-free air stream into said transport container during pressure fluctuations.

3. A transport container as claimed in claim 1, further comprising:
    four L-shaped elevations on said inside bottom plate for receiving the semiconductor wafer cassette.

4. A transport container as claimed in claim 1, wherein said inside bottom plate includes a U-shaped edge extending about said inside bottom plate for accepting said sealing element.

5. A transport container as claimed in claim 1, further comprising:
    first and second inwardly directed nubs extending from said inside hood to which the semiconductor wafer holder is secured.

6. A transport container as claimed in claim 1, further comprising:
    outwardly direct nubs extending from said inside hood to which said outside hood is secured.

7. A transport container as claimed in claim 1, further comprising:
    an outwardly directed centering ring provided in a center of said inside hood.

8. A transport container as claimed in claim 1, wherein said outside hood includes depressions for securing said closing lever.

9. A transport container as claimed in claim 1, wherein said sealing element is of silicone rubber and polyethylene film.

10. A transport container as claimed in claim 9, wherein said silicone rubber sealing element has a material hardness of about 5 degrees Shore and said polyethylene film has a thickness of about 0.1 mm.

11. A transport container as claimed in claim 1, wherein said interchangeable semiconductor wafer holder includes:
    first and second lateral longitudinal webs;
    a reinforced center web;
    a third narrow web connected by a first film hinge to said center web extending in an upward direction;
    a perpendicularly disposed fourth web connected to said third narrow web by a second film hinge, said fourth web including first and second depressions for fastening to said inside hood;
    fifth and sixth webs connected to said center web extending by respective film hinges in a downward direction;
    a seventh web connected in a middle of said center web; and
    a spacer disposed at a lower region of said semiconductor wafer holder to provide a space between said inside bottom plate and said semiconductor wafer holder.

* * * * *